United States Patent [19]
Stephens, Jr.

[11] Patent Number: 6,018,489
[45] Date of Patent: Jan. 25, 2000

[54] MOCK WORDLINE SCHEME FOR TIMING CONTROL

[75] Inventor: Michael C. Stephens, Jr., San Jose, Calif.

[73] Assignee: Vanguard International Semiconductor Corporation, Taiwan

[21] Appl. No.: 09/156,183

[22] Filed: Sep. 17, 1998

[51] Int. Cl.[7] .................................. G11C 8/00; G11C 7/02
[52] U.S. Cl. .............................. 365/230.03; 365/230.06; 365/208
[58] Field of Search .................. 365/230.03, 230.06, 365/194, 205, 207, 208

[56] References Cited

U.S. PATENT DOCUMENTS

| | | | |
|---|---|---|---|
| 5,491,664 | 2/1996 | Phelan | 365/200 |
| 5,625,790 | 4/1997 | Cutter | 365/230.06 |
| 5,856,952 | 1/1999 | Yoo et al. | 365/230.03 |
| 5,966,315 | 10/1999 | Muller et al. | 365/207 |
| 5,970,010 | 10/1999 | Hira et al. | 365/205 |

*Primary Examiner*—Trong Phan
*Attorney, Agent, or Firm*—Christensen, O'Connor, Johnson & Kindess PLLC

[57] ABSTRACT

A mock wordline timing scheme is used in a memory device having a plurality of memory cells arranged in array blocks. The array blocks are further arranged in groups, with each array block being located between a pair of corresponding sense amplifier banks. Each array block has at least one mock wordline, and each sense amplifier bank is shared by the array blocks located on either side of the sense amplifier bank, except the sense amplifier banks located on the ends of the group of array blocks. Each sense amplifier bank has a corresponding sense timing control circuit coupled to receive an enable signal and a timing signal. In response to an address, a row decoder is configured to be selected to drive the addressed word line. In conjunction with the row decoder, the enable and timing signals of the sense amplifier bank adjacent to the array block containing the addressed memory cell are asserted. The row decoder causes the timing signal to be propagated through a mock wordline that is not in the same array block as the addressed memory cell. Thus, memory cells in the active array are not disturbed, which could result in incorrect sensing and data corruption. Further, unlike some conventional schemes, the selected mock wordline is in an inactive array block even if the active array block is at an end of the bank of array blocks.

32 Claims, 3 Drawing Sheets

Fig. 1

(PRIOR ART)

MOCK WORDLINE SCHEME FOR TIMING CONTROL

FIELD OF THE INVENTION

The present invention relates to integrated circuit memories and, more particularly, to timing control circuits for sensing the state of memory cells of integrated circuit memories.

BACKGROUND INFORMATION

Figure 1:
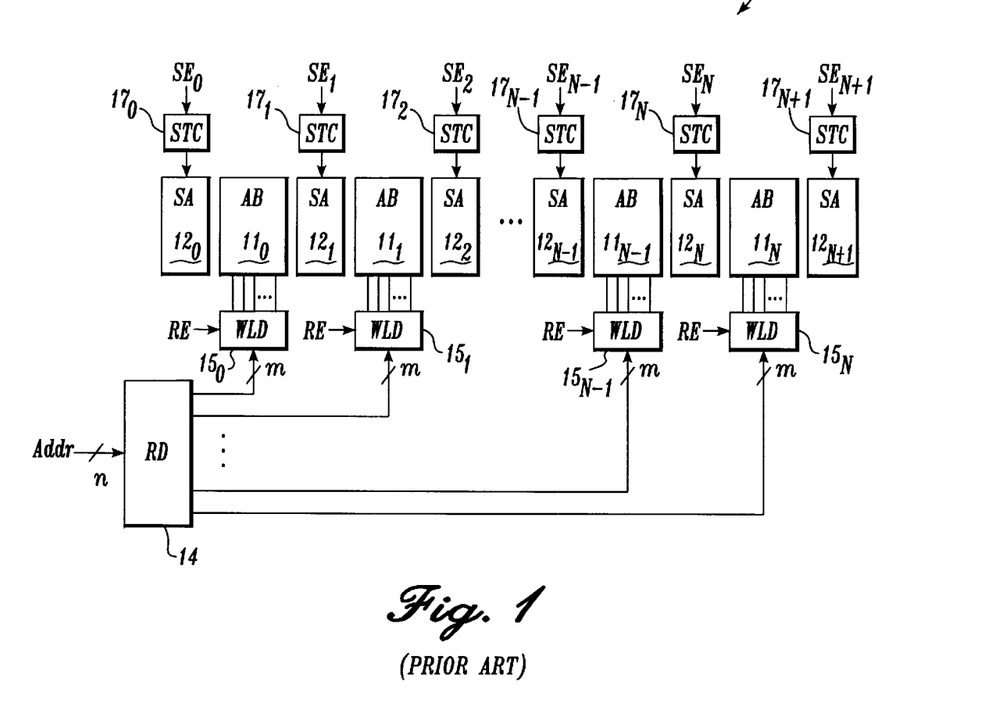
FIG. 1 is a simplified block diagram illustrative of part of the layout of an exemplary integrated circuit memory.

Integrated circuit memories typically have an architecture in which memory cells are arranged in array blocks, with the array blocks being organized into banks. Each memory cell is accessed by appropriate activation of bitlines and wordlines. FIG. 1 is a simplified block diagram illustrative of a group 10 of the layout of an exemplary integrated circuit memory. Group 10 includes array blocks $11_0$-$11_N$) with shared sense amplifier banks $12_0$-$12_{N+1}$ disposed between array blocks $11_0$-$11_N$. Group 10 also includes a row decoder 14, wordline driver blocks $15_0$-$15_N$ corresponding to array blocks $11_0$-$11_N$, and sense timing and control circuits $17_0$-$17_{N+1}$ corresponding to sense amplifier banks $12_0$-$12_{N+1}$.

A brief summary of the operation of group 10 during a memory access operation is set forth below. The summary is not intended to completely describe the operation of the integrated circuit memory, which is generally well known in the art, but rather to illustrate one of the timing parameters that designers generally seek to optimize.

A "row" portion of the memory address is received by row decoder 14, which then activates the appropriate wordline driver of wordline driver blocks $15_0$-$15_N$ corresponding to the address. Typically, decoded address signals are received by the wordline driver blocks, which are then triggered by a row enable signal RE. That is, in a given cycle, the addressed wordline is not activated until row enable signal RE is asserted. Generally, the mapping of the memory addresses to memory cells is defined so that, depending on the number of array blocks, the most significant bits select one of memory arrays $11_0$-$11_N$, and the lower order bits select one of the wordlines within the selected array block. Thus, only one of array blocks $11_0$-$11_N$ is selected at a time, with only one wordline within the selected array block being activated.

Figure 2:
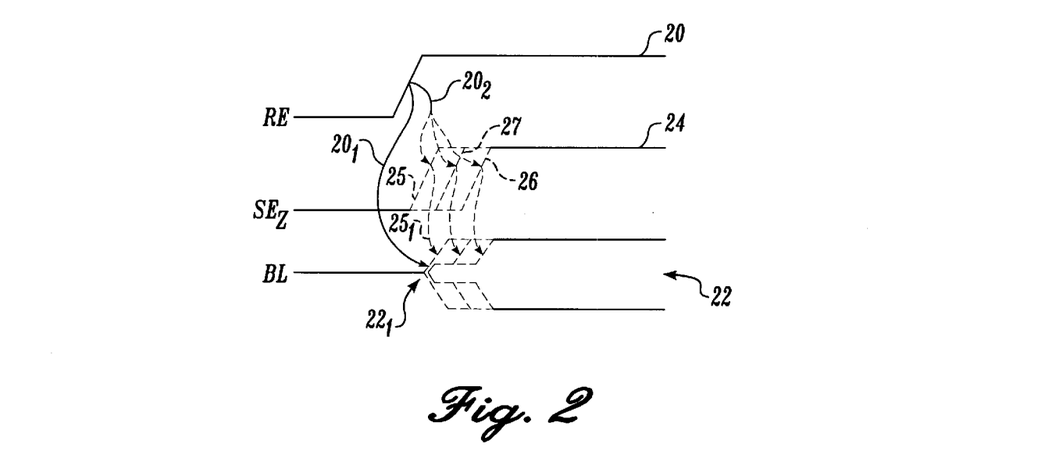
FIG. 2 is a timing diagram illustrative of timing between activation of a wordline and the activation of the corresponding sense amplifier in an integrated circuit memory.

At about the time that the wordline of the selected array block is being activated, a corresponding sense amplifier bank for the selected memory cell is also activated. As shown in FIG. 1, sense timing control circuits $17_0$-$17_{N+1}$ provide control signals to the sense amplifier banks $12_0$-$12_{N+1}$ in response to sense enable signals $SE_0$-$SE_{N+1}$. The timing between the activation of the sense amplifier bank and the availability of data from the selected memory cell is important with regard to access time and data detection, as described below. FIG. 2 illustrates the relationship between row enable signal RE, the bitline data signal and the corresponding sense enable signal. As shown in FIG. 2, row enable signal RE is represented by a a waveform 20, the bitline data signal is represented by a waveform 22 and the sense enable signal is represented by a waveform 24. As indicated by an arrow $20_1$, in response to row enable signal RE being asserted, the appropriate wordline driver is activated, which allows the memory cells connected to the activated wordline to drive their corresponding bitlines to the stored data levels. The accessing of the memory cell results in charge sharing differential on the bit line, as indicated by an arrow $22_1$.

In addition, as indicated by an arrow $20_2$, assertion of row enable signal RE is also involved in the assertion of the appropriate sense enable signal (indicated herein as signal $SE_Z$, with Z representing an integer between zero and N+1, inclusive). The assertion of the sense enable signal causes activation of the corresponding sense amplifier bank, which amplifies the bitline signal. If the timing of signal $SE_Z$ is such that the leading edge of signal $SE_Z$ is relatively early (as illustrated by leading edge 25), then the corresponding sense amplifier bank $SA_Z$ can be activated before the corresponding selected memory cell can fully develop the data onto the selected bitline. As a result, the data could be sensed incorrectly and result in data corruption.

On the other hand, if the timing of signal $SE_Z$ is such that the leading edge of signal $SE_Z$ is relatively late (as illustrated by leading edge 26), then the corresponding sense amplifier bank $SA_Z$ can be activated a relatively long time after the corresponding selected memory cell fully develops data onto the corresponding bitline. Although the data will most likely be sensed correctly, the unneeded delay undesirably increases the minimum access time of the memory device. Accordingly, it is desirable to design the timing of signal $SE_Z$ such that the leading edge of signal $SE_Z$ occurs so as to activate the corresponding sense amplifier $SA_Z$ as soon as the selected memory cell develops the data on the bitlines, thereby allowing accurate sensing of the data while minimizing the access time. This is illustrated by leading edge 27 in FIG. 2.

Figure 3:
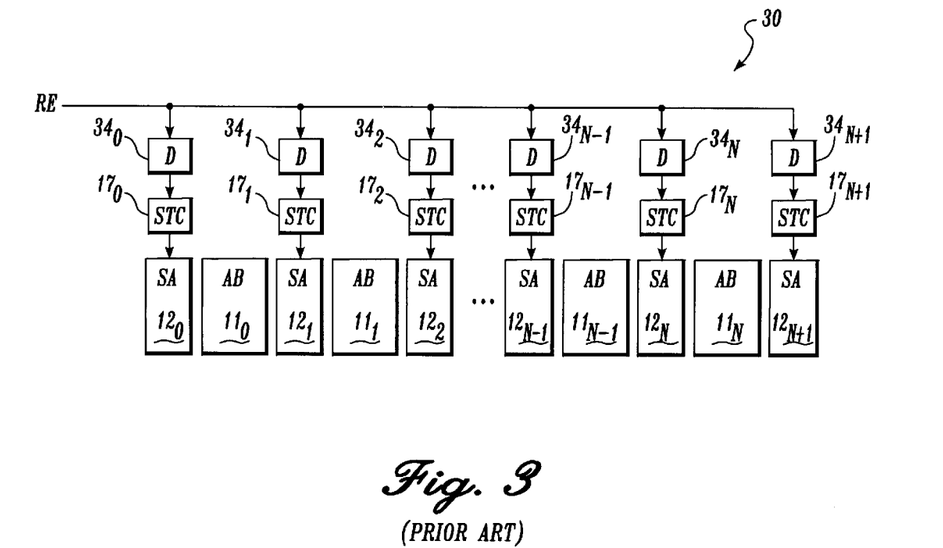
FIG. 3 is a simplified block diagram illustrative of a conventional scheme to control the timing of the sense amplifier activation using a delay block.

FIG. 3 is a simplified block diagram illustrative of a group 30 of an integrated circuit memory that uses delay blocks $34_0$-$34_{N+1}$ to help control the timing of the sense amplifier activation. For clarity, the same reference numbers are used between drawings to indicate elements having the same or similar structure or function. Also, the row decoder and wordline driver blocks are omitted from the figure for clarity. Delay blocks $34_0$-$34_{N+1}$ are connected to receive row enable signal RE. Each delay block is designed to approximate the timing of the wordline activation in its corresponding array blocks. Also, sense timing control circuit $17_0$-$17_{N+1}$ are connected to receive the output signals of delay blocks $34_0$-$34_{N+1}$, respectively. Otherwise, group 30 is similar to group 10 (FIG. 1) in architecture.

One problem with this scheme is that the timing can be relatively inaccurate. More specifically, due to the physical layout of sense amplifier banks $12_0$-$12_{N+1}$, the propagation delay of row enable signal RE to the each of delay blocks $34_0$-$34_{N+1}$ will be different. Delay blocks $34_0$-$34_{N+1}$ are typically implemented with a series of inverters and, thus, may not accurately track varying propagation delays due to process variations. For example, wordlines are commonly implemented using polysilicon, which may have resistances that can vary for different process runs. Because the propagation delay of the wordlines can account for a significant portion of the delay between assertion of row enable signal RE and availability of the corresponding data on the bitlines, the timing of when data signals are available on the bitlines can vary significantly.

A refinement of this scheme is to place a block of unused memory cells near array blocks $11_0$-$11_N$ to serve as delay block 32. This scheme may use boundary memory cells (i.e., not used for storage) that may already be present. The delay of this version of delay block 32 would be provided by the wordlines in this block of unused memory cells. This approach still does not address the differences in propagation delay due to the physical layout of sense amplifier banks $12_0$-$12_{N+1}$ and the extra unused memory cells and, in addition, may undesirably use a significant amount of chip area.

Figure 4:
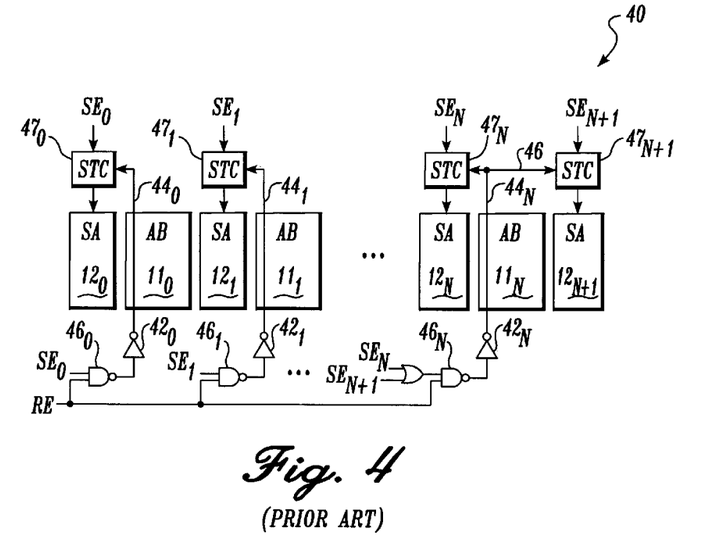
FIG. 4 is a simplified block diagram illustrative of another conventional scheme to control the timing of the sense amplifier activation using mock wordlines.

FIG. 4 is a simplified block diagram illustrative of a group 40 of an integrated circuit memory that uses selectively activated wordline drivers $42_0$-$42_N$ along with mock wordlines $44_0$-$44_N$ to control the activation of sense amplifier banks $12_0$-$12_{N+1}$. In this example, mock wordlines $44_0$-$44_N$ are local boundary wordlines located on the left side of array blocks $11_0$-$11_N$, respectively, and are essentially identical to the normal wordlines of these array blocks. In FIG. 4, mock wordline drivers $42_0$-$42_N$ are shown for driving mock wordlines $44_0$-$44_N$, respectively. As will be appreciated by those skilled in the art of integrated circuit memories, wordline drivers $42_0$-$42_N$ are part of wordline driver blocks $15_0$-$15_N$ (FIG. 1), with the other wordline drivers for the normal wordlines being omitted for clarity.

In this scheme, when a sense timing control circuit $17_Z$ (Z being an integer between zero and N, inclusive) is to be activated, the mock wordline in array block $11_Z$ (i.e., the array block to the right of the sense amplifier bank to be activated in this example circuit) is used to propagate the activation signal. In this example, mock wordlines $44_0$-$44_N$ are connected to corresponding wordline drivers $42_0$-$42_N$, respectively. Wordline drivers $42_0$-$42_N$ are connected to the output leads of NAND gates $46_0$-$46_N$, which are all also connected to receive row enable signal RE as an input signal. In addition, in this example, NAND gates $46_0$-$46_{N-1}$ are connected to receive enable signals $SE_0$-$SE_{N-1}$, respectively, as another input signal. NAND gate $46_N$ is connected to receive the logical OR of sense enable signals $SE_N$ and $SE_{N+1}$. Mock wordlines $44_0$-$44_N$ are connected to sense timing control circuits $47_0$-$47_N$, respectively. Sense timing control circuits $47_0$-$47_N$ are substantially similar to sense timing control circuits $17_0$-$17_N$ (FIG. 1), except that sense timing circuits $47_0$-$47_N$ are selectively activated by the signal propagated by mock wordlines $44_0$-$44_N$, respectively.

Through the operation of NAND gates $46_0$-$46_N$ in response to the sense enable signals and row enable signal RE, the appropriate mock wordline is selected to activate the appropriate sense amplifier bank. For example, in a typical folded or segmented bitline architecture, when a wordline near the right side on array block $11_0$ is activated in a memory access operation, sense enable signal $SE_1$ is typically asserted by conventional address decode circuitry (not shown) so as to activate sense amplifier bank $12_1$. As a result, mock wordline $44_1$ is selected by NAND gate $46_1$ and inverting wordline driver $42_1$, in response to signal $SE_1$ and the row enable signal RE. The signal propagated by the activated mock wordline then activates sense timing control circuit $47_1$. Because the selected mock wordline is relatively close to the activated normal wordline, the timing in activating the appropriate sense amplifier bank is more accurate compared to the previously described conventional methods.

However, this method still has problems in that activating the sense amplifier banks on either end of the array blocks (i.e., sense amplifier banks $12_0$ and $12_{N+1}$) may undesirably cause a mock wordline within the activated array block to be activated. For example, when a wordline near the right side of array block $11_N$ is activated in a memory access operation, sense enable signal $SE_{N+1}$ is typically asserted so as to activate sense amplifier bank $12_{N+1}$. However, in this example architecture, mock wordline $44_N$ is used to enable sense timing control circuit $47_{N+1}$ to activate sense amplifier bank $12_{N+1}$. Consequently, the activated mock wordline (i.e., wordline $44_N$) is undesirably in the activated array block (i.e., array block $11_N$). As a result, the activated mock wordline may disturb and/or reduce the voltage differential between the selected bitlines by accessing a row of boundary memory cells simultaneously with the accessing of a row of memory cells by the activated normal wordline. The simultaneous accessing of two rows of memory cells in array block $11_N$ can result in sense margin reduction or data corruption in array block $11_N$. This type of problem also occurs when a wordline near the left side of array block $11_0$ is activated in a memory access operation.

Accordingly, there is a need for a timing scheme that accurately tracks the propagation delay in developing data on a bitline during a memory access operation without accessing other memory cells in the activated array block.

SUMMARY

In accordance with the present invention, an improved mock wordline timing scheme is provided for use in a memory device having a plurality of memory cells arranged in array blocks. The array blocks are further arranged in groups, with each array block being located between a pair of corresponding sense amplifier banks. In one embodiment, each array block has at least one mock wordline, and each sense amplifier bank is shared by the array blocks located on either side of the sense amplifier bank (except, of course, the sense amplifier banks located on the ends of the group of array blocks).

Each sense amplifier bank has a corresponding sense timing control circuit coupled to receive an enable signal and a timing signal. In response to an address, a row decoder is selected and subsequently drives a wordline. In conjunction with the row decoder, the enable and timing signals are generated to activate the sense amplifier bank adjacent to the array block containing the addressed memory cell (i.e., the active array block). In particular, the row decoder causes the timing signal to be propagated through a mock wordline that is not in the same array block as the addressed memory cell (i.e., the selected mock wordline is in an inactive array block). In this way, memory cells in the active array are not disturbed, which could result in incorrect sensing and data corruption. Further, unlike some conventional schemes, the selected mock wordline is in an inactive array block even if the active array block is at an end of the group of array blocks.

In one embodiment, each array block contains two mock wordlines, one on either side of the array block. In addition to being in an inactive array block as described above, the row decoder is also configured to select the mock wordline that is closest to the sense amplifier bank to be activated. For most addresses, this mock wordline is adjacent to the sense amplifier bank to be activated. That is, for these addresses, the selected mock wordline is in the array block located on the side of the sense amplifier bank that is opposite from the active array block. However, when the address corresponds to a memory cell that is to be sensed using the sense amplifier bank that is at an end of the bank of array blocks, there is no inactive array block on the other side of the sense amplifier bank to be activated. For these addresses, the selected mock wordline is in the one array block next to the active array block. Metal interconnect is used to connect the mock wordline to the sense amplifier bank, thereby reducing the delay caused by the extra distance that the sense amplifier timing signal must travel to the "end" sense amplifier bank.

BRIEF DESCRIPTION OF THE DRAWINGS

The foregoing aspects and many of the attendant advantages of this invention will become more readily appreciated by reference to the following detailed description, when taken in conjunction with the accompanying drawings listed below.

DETAILED DESCRIPTION

Figure 5:
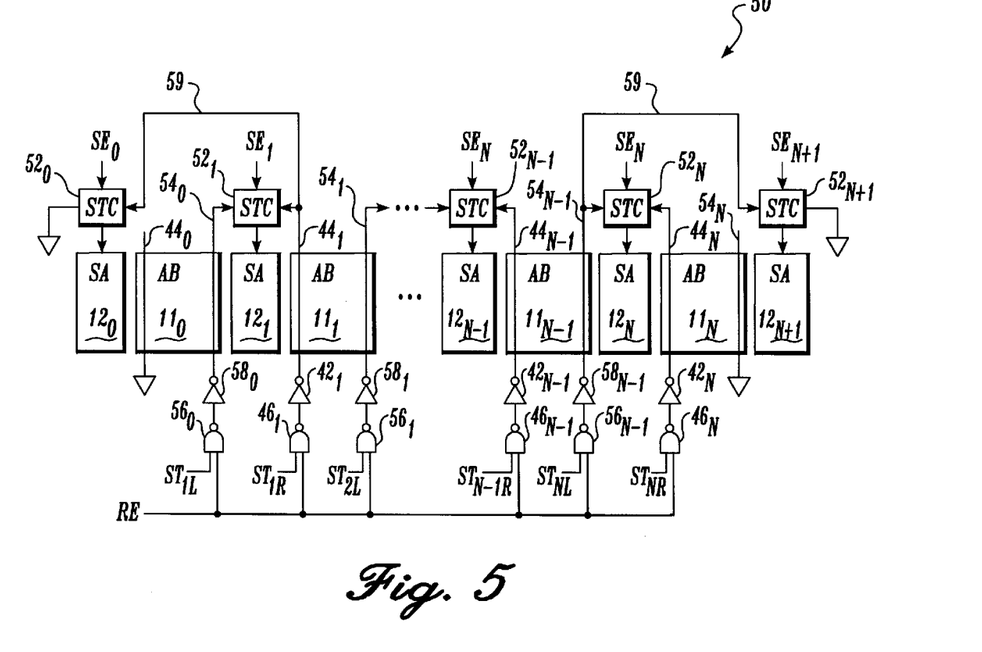
FIG. 5 is a simplified block diagram illustrative of a portion of an integrated circuit memory having an improved mock wordline architecture, according to the present invention.

FIG. 5 is a simplified block diagram illustrative of a group 50 of an integrated circuit memory having an improved mock wordline architecture. Group 50 is similar to group 40 (FIG. 4) except that: (a) inverter $42_0$ and NAND gate $46_0$ are omitted; and (b) group 50 includes sense timing control circuits $52_0$-$52_{N+1}$ instead of sense timing control circuits $47_0$-$47_N$. Sense timing control circuits $52_0$-$52_{N+1}$ have two activation input leads are described further below in conjunction with FIG. 6. In addition, group 50 includes mock wordlines $54_0$-$54_N$ disposed on the right side of array blocks (AB) $11_0$-$11_N$, respectively, and also includes additional NAND gates $56_0$-$56_{N-1}$ connected to mock wordlines $54_0$-$54_{N-1}$ through wordline drivers $58_0$-$58_{N-1}$. Mock wordlines $44_0$ and $54_N$ are connected to the ground bus.

As shown in FIG. 5, mock wordlines $44_0$ and $54_N$ are the outer-most mock wordlines of group 50 and, according to the symmetrical layout of the bank, would be expected to be connected to sense timing control circuits $52_0$ and $52_{N+1}$, respectively. However, in another aspect of this embodiment, mock wordlines $44_0$ and $54_N$ are connected to the ground bus instead, with sense timing control circuits $52_0$ and $52_{N+1}$ being connected to mock wordlines $44_1$ and $54_{N-1}$, respectively. In this embodiment, metal interconnects 59 are used to electrically connect sense timing control circuits $52_0$ and $52_{N+1}$ to mock wordlines $44_1$ and $54_{N-1}$, respectively, to reduce resistance.

NAND gates $56_0$-$56_{N-1}$ are each connected to receive row enable signal RE and are also connected to receive sense timing signals $ST_{1L}$-$ST_{NL}$, respectively. As shown in FIG. 5, sense timing signals $ST_{1L}$-$ST_{NL}$ are the sense timing signals that are asserted to activate mock wordlines to the left of the selected sense amplifier bank. Similarly, NAND gates $46_1$-$46_N$ are connected to receive sense timing signals $ST_{1R}$-$ST_{NR}$, respectively, instead of sense enable signals $SE_0$-$SE_N$ as in group 40 (FIG. 4). As shown in FIG. 5, sense timing signals $ST_{1R}$-$ST_{NR}$ are the sense timing signals that are asserted to activate mock wordlines to the right of the selected sense amplifier bank. Sense timing control circuits $52_0$-$52_{N+1}$ are substantially similar to sense timing control circuits $47_0$-$47_{N+1}$ (FIG. 4), except that each of sense timing control circuits $52_0$-$52_{N+1}$ has two activation input leads for activating the sense timing control circuit. Each sense timing control circuit $52_Z$ of sense timing control circuits $52_1$-$52_N$ (i.e., not including array blocks $52_0$ and $52_{N+1}$ that are at the ends of group 50) has one activation input lead connected to the mock wordline of the array block on the left of the sense timing control circuit, and the other activation input lead connected to the mock wordline of the array block to the right of the sense timing control circuit. That is, each sense timing control circuit $52_Z$ has one activation input lead connected to mock wordline $54_{Z-1}$ and another connected to mock wordline $44_Z$.

In contrast, sense timing control circuit $52_0$ has one activation input lead connected to the ground bus and the other activation input lead connected to mock wordline $44_0$. Similarly, sense timing control circuit $52_{N+1}$ has one activation input lead connected to the ground bus and the other activation input lead connected to mock wordline $54_N$.

For each of sense timing control circuits $52_0$-$52_{N+1}$, when enabled by its corresponding sense enable signal, assertion of a signal received on either activation input lead causes the sense timing control circuit to be activated. In an alternative embodiment, sense timing control circuits $52_0$-$52_{N+1}$ can be replaced by sense timing control circuits $47_0$-$47_{N+1}$ with each sense timing control circuit $47_0$-$47_{N+1}$ being connected to a corresponding two-input OR gate. Each of these OR gates has its output lead connected to the single activation input lead of its corresponding sense timing control circuit. In addition, the two input leads of each OR gate serve as the two activation input leads for its corresponding sense timing control circuits $47_0$-$47_{N+1}$.

In another alternative embodiment, sense timing control circuits $52_0$ and $52_{N+1}$ may be replaced with conventional single-input sense timing control circuits such shown in FIG. 4 because the sense timing control circuits $52_0$ and $52_{N+1}$ each have only one activation input lead connected to a mock wordline (i.e., the other activation input lead is connected to the ground bus).

Sense timing signals $ST_{1R}$-$ST_{NR}$ and $ST_{1L}$-$ST_{NL}$ are generated by a conventional row decoder (not shown) so that, in response to the address of the memory access operation, the appropriate sense timing signal is asserted to activate the appropriate mock wordline. The appropriate mock wordline is the mock wordline (of a non-active array block in group 50) that is nearest to the sense amplifier bank corresponding to the particular memory cell being accessed. In particular, the row decoder (not shown) is configured to assert a predetermined one of sense timing signals $ST_{1R}$-$ST_{NR}$ so as to activate the mock wordline that is both: (i) in a non-active array block, and (ii) nearest the sense amplifier bank to be activated. In light of the present disclosure, those skilled in the art of integrated circuit memories can, without undue experimentation, implement and configure the row decoder (not shown) so that the address of each memory cell is mapped to the appropriate mock wordline.

In this embodiment when memory cells of "end" array blocks $11_0$ or $11_N$ are being accessed, the corresponding "end" sense amplifier banks $12_0$ or $12_{N+1}$ would be activated, respectively. Consequently, the nearest non-active array block would be array block $11_1$ or $11_{N-1}$, respectively. In these cases, the row decoder (not shown) is configured to activate mock wordlines $44_1$ or $54_{N-1}$, respectively, by asserting signals $SE_{1R}$ or $SE_{NL}$, respectively. Although mock wordlines $44_1$ and $54_{N-1}$ are located relatively far away from sense amplifier banks $12_0$ and $12_{N+1}$, respectively, metal interconnects 59 used to electrically connect these mock wordlines to sense timing control circuits $52_0$ and $52_{N+1}$ incur only a relatively small amount of extra propagation delay, which is typically insignificant in comparison to the propagation delay from the polysilicon mock wordlines.

In a further refinement, mock wordlines $44_1$ and $54_{N-1}$ can be tapped anywhere along their lengths by metal interconnect 59 to equalize the total propagation delay of the path to the sense amplifier bank, relative to the normal wordline path to the memory cell.

Some examples are described below to further illustrate the operation of this embodiment. When a memory cell on the left side of array block $11_N$ is to be accessed, the row decoder (not shown) is configured to assert both sense enable signal $SE_N$ and sense timing signal $ST_{NL}$. As a result, sense timing control circuit $52_N$ is enabled by sense enable signal $SE_N$, while sense timing signal $ST_{NL}$ is received at one input lead of NAND gate $56_{N-1}$ When row enable signal RE is asserted, sense timing control circuit $52_N$ is then activated by NAND gate $56_{N-1}$ and wordline driver $58_{N-1}$, in response to the output signal of wordline driver $58_{N-1}$ propagating through mock wordline $54_{N-1}$ in adjacent array block $11_{N-1}$. Because the activated mock wordline is in a non-activated array block, the activated mock wordline avoids disturbing memory cells in the array block of the addressed memory cell. In addition, being on the right side of array block $11_{N-1}$, mock wordline $54_{N-1}$ is relatively closer to the addressed normal wordline in array block $11_N$, compared to the aforementioned conventional scheme that has mock wordlines only on the left side of the array blocks. Thus, this scheme provides more accurate tracking of the actual timing of the memory cell access.

On the other hand, when a memory cell on the right side of array block $11_N$ is to be accessed, the row decoder (not shown) is configured to assert sense enable signal $SE_{N+1}$ and sense timing signal $ST_{NL}$. As a result, sense timing control circuit $52_{N+1}$ is enabled by sense enable signal $SE_{N+1}$, while sense timing signal $ST_{NL}$ is received at one input lead of NAND gate $56_{N-1}$. When row enable signal RE is asserted, sense timing control circuit $52_{N+1}$ is then activated by NAND gate $56_{N-1}$ and wordline driver $58_{N-1}$, in response to the output signal of wordline driver $58_{N-1}$ propagating through mock wordline $54_{N-1}$ in adjacent array block $11_{N-1}$ and metal interconnect 59. Unlike in the conventional scheme of group 40 (FIG. 4), the activated mock wordline is in a non-activated array block, thereby avoiding disruption of memory cells in the array block of the addressed memory cell. As described above, metal interconnect 59 significantly reduces the extra propagation delay due to the farther difference between mock wordline $54_{N-1}$ and sense timing control circuit $52_{N+1}$. Thus, this situation still results in accurate tracking of the actual timing of the memory cell access without disturbing unaddressed memory cells in the active array block.

Similar to the first example, when a memory cell on the right side of array block $11_{N-1}$ is to be accessed, the row decoder (not shown) is configured to assert both sense enable signal $SE_N$ and sense timing signal $ST_{NR}$. As a result, sense timing control circuit $52_N$ is enabled by sense enable signal $SE_N$, while sense timing signal $ST_{NR}$ is received at one input lead of NAND gate $56_N$. When row enable signal RE is asserted, sense timing control circuit $52_N$ is then activated by NAND gate $56_N$ and wordline driver $58_N$, in response to the output signal of wordline driver $58_N$ propagating through mock wordline $44_N$ in adjacent array block $11_N$ Again, the activated mock wordline is in a non-activated array block and is relatively close to the active normal wordline of the addressed memory cell. Thus, memory cells in the array block of the addressed memory cell are not unnecessarily disturbed and the timing of the memory cell access is accurately tracked.

Figure 6:
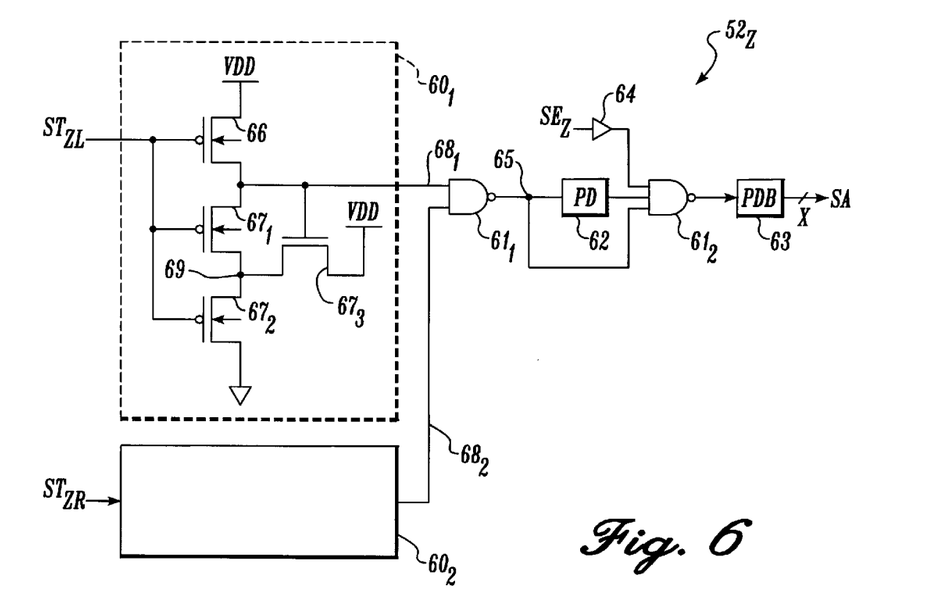
FIG. 6 is a schematic diagram illustrative of a sense timing control circuit, according to one embodiment of the present invention.

FIG. 6 is a schematic diagram illustrative of a sense timing control circuit $52_Z$, according to one embodiment of the present invention. This embodiment of sense timing control circuit $52_Z$ includes input circuits $60_1$ and $60_2$, NAND gates $61_1$ and $61_2$, a programmable delay circuit 62, a programmable delay output buffer circuit 63 and a buffer 64. Input circuits $60_1$ and $60_2$ are essentially identical, being configured to invert the received signal with a delayed high-to-low output signal transition. Input circuit $60_1$ is connected to receive signal $ST_{ZL}$ (via NAND gate $56_{Z-1}$ and wordline driver $58_{Z-1}$) and input circuit $60_2$ is connected to receive signal $ST_{ZR}$ (via NAND gate $46_Z$ and wordline driver $42_Z$). Two-input NAND gate $61_1$ is connected to receive the output signals from input circuits $60_1$ and $60_2$.

The output lead of NAND gate $61_1$ is connected to the input lead of programmable delay circuit 62 through a node 65. Node 65, the output lead of programmable delay circuit 62 and the output lead of buffer 64 are connected to the input leads of three-input NAND gate $61_2$, with buffer 64 being connected to receive sense enable signal $SE_Z$. The output lead of NAND gate $61_2$ is connected to the input lead of programmable delay output buffer 63, which generates several sense amplifier timing signals as a function of the output signal from NAND gate $61_2$. Programmable delay output buffer 63 is conventional, generating one or more sense amplifier timing signals (with the number of timing signals depending on the design of the sense amplifiers). In one embodiment, programmable delay output buffer 63 generates two differential timing signals from the output signal of NAND gate $61_2$, with varying amounts of delay between the two sets of signals.

Programmable delay circuit 62 and programmable delay output buffer 63 have delay elements (not shown) that can be programmably connected into the signal propagation path. In one embodiment, standard metal option techniques are used to adjust the delay as desired. In alternative embodiments, the delay elements may be programmably connected into the signal propagation path by fuses, antifuses, laser techniques, etc. The delay elements (not shown) are typically implemented with an even number of inverting stages.

Input circuit $60_1$ includes a P-channel transistor 66 and three N-channel transistors $67_1$–$67_3$. P-channel transistor 66 has its source connected to the VDD supply bus, its gate connected to receive sense timing signal $ST_{ZL}$ (via mock wordline $54_{Z-1}$, NAND gate $56_{Z-1}$ and wordline driver $58_{Z-1}$), and its drain connected to an output lead $68_1$. Output lead $68_1$ is also connected to one input lead of NAND gate $61_1$. N-channel transistor $67_1$ has its drain connected to output lead $68_1$, and has its gate connected to the gates of transistors 66 and $67_2$, and has its source connected to a node 69. N-channel transistor $67_2$ has its source connected to the ground bus and its drain connected to node 69. N-channel transistor $67_3$ has its source connected to node 69, it gate connected to output lead $68_1$, and its drain connected to the VDD supply bus. Output lead $68_1$ is connected to one of the input leads of NAND gate $61_1$. Input circuit $60_2$ is substantially similar to input circuit $60_1$, except that input circuit has an output lead $68_2$ connected to the other input lead of NAND gate $61_1$.

Sense timing control circuit $52_Z$ operates as follows. Input circuits 601 and $60_2$ form, in effect, conventional CMOS inverters, with an extra delay mechanism to slow down high-to-low output signal transitions. For example, when sense timing signal $ST_{ZL}$ is at a logic low level, P-channel transistor 66 is turned on while N-channel transistors $67_1$ and $67_2$ are turned off. As a result, the voltage at output lead $68_1$ is pulled up to a logic high level. This logic high level at output lead $68_1$ causes N-channel transistor $67_3$ to be turned on, thereby causing the voltage at node 69 to be about a threshold voltage (of N-channel transistor $67_3$) below the level of the VDD supply voltage (i.e., VDD-$V_{tn}$). Then, when sense timing signal $ST_{ZL}$ transitions to a logic high level, P-channel transistor 66 begins to turn off and N-channel transistor $67_2$ begins to turn on.

However, because the voltage at node 69 has a value that is about equal to VDD-$V_{tn}$, N-channel transistor $67_1$ does not turn on at the same time as N-channel transistor $67_2$. Instead, N-channel transistor $67_1$ begins to turns on (to start pulling down the voltage at output lead $68_1$) when the voltage level of sense timing signal $ST_{ZL}$ reaches a relatively high level about equal to a threshold voltage above the voltage level at node 69. The voltage level at node 69, at the start of the high-to-low transition of the output signal, was about equal to a threshold voltage below the VDD supply voltage, but would be slightly lower than this level due to N-channel transistor $67_2$ being turned on. As a result of the operation of N-channel transistor $67_3$, high-to-low transitions of the output signal at output lead $68_1$ are relatively slow.

Then when sense timing signal $ST_{ZL}$ transitions from a logic high level to a logic low level (i.e., causing a low-to-high output signal transition), P-channel transistor 66 begins to turn on while N-channel transistors $67_1$ and $67_2$ begin to turn off. Although the gate capacitance of N-channel transistor $67_3$ tends to slow down P-channel 66 in pulling up the voltage at output lead $68_1$, this delay is significantly less than the delay provided by N-channel transistor $67_3$ during a high-to-low output signal transition.

Input circuit $60_2$ has one P-channel transistor and three N-channel transistors (not shown) that are interconnected in an identical manner as input circuit $60_1$, except for receiving sense timing signal $ST_{ZR}$ (via mock wordline $44_Z$, NAND gate $46_Z$ and wordline driver $42_Z$) and generating the output signal on output lead $68_2$. Consequently, input circuit $60_2$ operates in substantially the same manner as input circuit $60_1$.

When sense timing signals $ST_{ZL}$ and $ST_{ZR}$ are both deasserted (i.e., at logic low levels in this embodiment), input circuits $60_1$ and $60_2$ both generate logic high output signals that are received by NAND gate $61_1$. Thus, NAND gate $61_1$ outputs a logic low signal to programmable delay circuit 62 and NAND gate $61_2$. As a result, NAND gate $61_2$ outputs a logic high level signal to programmable delay output buffer 63. In response to a logic high level signal from NAND gate $61_2$, programmable delay output buffer 63 is configured to deassert the timing signals provided to the corresponding sense amplifier bank.

On the other hand, if sense timing signal $ST_{ZL}$ (or sense timing signal $ST_{ZR}$) are asserted, then input circuit $60_1$ (or input circuit $60_2$) will output a logic low signal to NAND gate $61_1$, which then will output a logic high signal to programmable delay circuit 62 and NAND gate $61_2$. Ordinarily, the row decoder (not shown) will have already asserted sense enable signal $SE_Z$ by the time sense timing signal $ST_{ZL}$ (or sense timing signal $ST_{ZR}$) has propagated through the mock wordline from the mock wordline's corresponding NAND gate and wordline driver. Thus, when the logic high signal from NAND gate $61_1$ propagates through programmable delay circuit 62, NAND gate $61_2$ will have logic high signals at all three of its input leads. As a result, NAND gate $61_2$ will output a logic low level signal to programmable delay output buffer 63, which in response thereto, asserts the timing signals to the corresponding sense amplifier bank. It will be appreciated by those skilled in the art of integrated circuit memories that the programmable delays of programmable delay circuit 62 and programmable delay output buffer 63 may be programmably adjusted to achieve the desired timing. In an alternative embodiment, NAND gate $61_2$ may be a two-input NAND gate having its input leads respectively connected to the output leads of programmable delay circuit 62 and buffer 64, provided appropriate one-sided delays are added in another part of the circuit.

It will also be appreciated by those skilled in the art of integrated circuit memories that if sense enable signal $SE_Z$ is not asserted (i.e., at a logic high level), NAND gate $61_2$ will continue to output a logic high level signal to programmable delay output buffer 63. This situation may occur with the sense timing control circuits at the ends of group 50 (FIG. 5). For example, referring to FIG. 5, mock wordline $54_{N-1}$ is used for both sense timing control circuits $52_N$ and $52_{N+1}$. Thus, for example, if sense timing control circuit $52_N$ is to be activated, then sense enable signal $SE_{N+1}$ may not be asserted, even though the sense timing signal from mock wordline $54_{N-1}$ is asserted and received by sense timing control circuit $52_{N+1}$. In this way, sense amplifier bank $12_N$ is activated while, advantageously, sense amplifier bank $12_{N+1}$ is not.

The embodiments of the regulator system described above are illustrative of the principles of the present invention and are not intended to limit the invention to the particular embodiments described. For example, those skilled in the art of integrated circuit memories, in light of this disclosure, can implement, without undue experimentation, other embodiments of the logic circuits of the sense amplifier timing control circuit that are different from the logic described but still achieve the same function. Further, if more delay is needed between the assertion of the row enable signal and the sense timing signals, a common delay block can be inserted. Accordingly, while the preferred embodiment of the invention has been illustrated and described, it will be appreciated that various changes can be made therein without departing from the spirit and scope of the invention.

I claim:

1. A circuit for activating sense amplifiers in a memory device, the memory device having a plurality memory cells arranged into a plurality of array blocks and a plurality of sense amplifier banks, the plurality of array blocks being arranged in a bank with each array block of the plurality of array blocks being located between corresponding pairs of adjacent sense amplifier banks of the plurality of sense amplifier banks, each memory cell having an address, the circuit comprising:

a plurality of mock wordlines, each array block of the plurality of array blocks having located therein at least one mock wordline of the plurality of mock wordlines;

for every memory cell of the plurality of memory cells, means for receiving an address and generating a first timing signal, the address corresponding to the memory cell, the memory cell being in a first array block of the plurality of array blocks, the first timing signal being propagated through a mock wordline located in a second array block of the plurality of array blocks, the second array block being different from the first array block; and     means for activating a first sense amplifier bank of the plurality of sense amplifier banks, the means for activating being activated as a function of the first timing signal.

2. The circuit of claim 1 wherein at least one array block of the plurality of array blocks has located therein two mock wordlines of the plurality of mock wordlines.

3. The circuit of claim 1 wherein the first sense amplifier bank is closest to the memory cell relative to all other sense amplifier banks of the plurality of sense amplifier banks.

4. The circuit of claim 1 wherein the second array block is adjacent to the first sense amplifier bank when the first array block is not at an end of the bank of array blocks.

5. The circuit of claim 1 wherein the second array block is not adjacent to the first sense amplifier bank when the first array block is located at an end of the bank of array blocks.

6. The circuit of claim 5 wherein the mock wordline of the second array block is also used to propagate a second timing signal to a second sense amplifier bank between the first and second array blocks, the second timing signal being generated in response to an address corresponding to a different memory cell of the plurality of memory cells.

7. The circuit of claim 5 further comprising an interconnect, wherein the interconnect is configured to couple the mock wordline of the second array block to the means for activating, the interconnect having a resistivity that is less than the resistivity of the mock wordline of the second array block.

8. The circuit of claim 7 wherein the means for activating is configured to provide at least one sense amplifier timing signal to the first sense amplifier bank as a function of a logic level of the first timing signal.

9. The circuit of claim 8 wherein the means for activating is further configured to receive an enable signal generated in response to the address of the memory cell, the means for activating providing the at least one sense amplifier timing signal as a function of the first timing signal and the enable signal.

10. The circuit of claim 8 wherein the sense timing control circuit includes a programmable delay circuit.

11. A circuit for activating sense amplifiers in a memory device, the memory device having a plurality memory cells arranged into a plurality of array blocks and a plurality of sense amplifier banks, the plurality of array blocks being arranged in a bank with each array block of the plurality of array blocks being located between corresponding pairs of adjacent sense amplifier banks of the plurality of sense amplifier banks, each memory cell having an address, the circuit comprising:

a plurality of mock wordlines, each array block of the plurality of array blocks having located therein at least one mock wordline of the plurality of mock wordlines;

for every memory cell of the plurality of memory cells, a logic circuit coupled to receive a decoded address signal, the decoded address signal corresponding to an address of the memory cell, the memory cell being in a first array block of the plurality of array blocks, wherein the logic circuit is configured to generate a first timing signal in response to the decoded address signal, the first timing signal being propagated through a mock wordline located in a second array block of the plurality of array blocks, the second array block being different from the first array block; and for every sense amplifier bank of the plurality of sense amplifier banks, a sense amplifier logic circuit having an output lead coupled to a corresponding sense amplifier bank and having a first input lead coupled to the mock wordline of the second array block, wherein the sense amplifier logic circuit is configured to be activated as a function of a logic level of the first timing signal.

12. The circuit of claim 11 wherein at least one array block of the plurality of array blocks has located therein two mock wordlines of the plurality of mock wordlines.

13. The circuit of claim 12 wherein the two mock wordlines of the at least one array block is located on opposite sides of the at least one array block.

14. The circuit of claim 11 wherein at least one sense amplifier logic circuit of the plurality of sense amplifier logic circuits has a second input lead coupled to a mock wordline of a third array block, the third array block being different from the first and second array blocks.

15. The circuit of claim 11 wherein the first sense amplifier bank is closest to the memory cell relative to all other sense amplifier banks of the plurality of sense amplifier banks.

16. The circuit of claim 11 wherein the second array block is adjacent to the first sense amplifier bank when the first array block is not at an end of the bank of array blocks.

17. The circuit of claim 11 wherein the second array block is not adjacent to the first sense amplifier bank when the first array block is located at an end of the bank of array blocks.

18. The circuit of claim 17 wherein the mock wordline of the second array block is also used to propagate a second timing signal to a second sense amplifier bank between the first and second array blocks, the second timing signal being generated in response to an address of a different memory cell of the plurality of memory cells.

19. The circuit of claim 17 further comprising an interconnect, wherein the interconnect is configured to couple the mock wordline to the means for activating, the interconnect having a resistivity that is less than the resistivity of the first mock wordline.

20. The circuit of claim 19 wherein the sense amplifier logic circuit is configured to provide at least one sense amplifier timing signal to the first sense amplifier bank as a function of a logic level of the first timing signal.

21. The circuit of claim 20 wherein the sense amplifier logic circuit is further configured to receive an enable signal generated in response to the address of the memory cell, the means for activating providing the at least one sense amplifier timing signal as a function of the first timing signal and the enable signal.

22. The circuit of claim 20 wherein the sense timing control circuit includes a programmable delay circuit.

23. A method of activating sense amplifiers in a memory device, the memory device having a plurality memory cells arranged into a plurality of array blocks and a plurality of sense amplifier banks, the plurality of array blocks being arranged in a bank with each array block of the plurality of array blocks being located between corresponding pairs of adjacent sense amplifier banks of the plurality of sense amplifier banks, the method comprising:

for every memory cell of the memory the plurality of memory cells, receiving an address corresponding to the memory cell, the memory cell being in a first array block of the plurality of array blocks;

generating a timing signal in response to the address of the memory cell using a decoder circuit;

propagating the timing signal through a first mock wordline located in a second array block of the plurality of array blocks, the second array block being different from the first array block; and in response to the timing signal, activating a first sense amplifier bank of the plurality of sense amplifier banks.

24. The method of claim 23 wherein at least one array block of the plurality of array blocks contains two mock wordlines.

25. The method of claim 23 wherein the first sense amplifier bank is closest to the memory cell relative to all other sense amplifier banks of the plurality of sense amplifier banks.

26. The method of claim 23 wherein the second array block is adjacent to the first sense amplifier bank when the first array block is not at an end of the bank of array blocks.

27. The method of claim 23 wherein the second array block is not adjacent to the first sense amplifier bank when the first array block is located at an end of the bank of array blocks.

28. The method of claim 27 wherein the first mock wordline of the second array block is also used to propagate a second timing signal to a second sense amplifier bank between the first and second array blocks, the second timing signal being generated in response to an address of a different memory cell of the plurality of memory cells.

29. The method of claim 27 wherein an interconnect is used to couple the first mock wordline to the first sense amplifier bank, the interconnect having a resistivity that is less than the resistivity of the first mock wordline.

30. The method of claim 29 further comprising, as a function of the first timing signal, providing to the first sense amplifier bank at least one sense amplifier timing signal using a sense timing control circuit.

31. The method of claim 30 further comprising, receiving at the sense timing control circuit an enable signal generated in response to the first address, the sense timing control circuit providing the at least one sense amplifier timing signal as a function of the first timing signal and the enable signal.

32. The method of claim 30 wherein the sense timing control circuit is coupled between the interconnect and the first mock wordline.

* * * * *